United States Patent [15] 3,638,141

Levine et al. [45] Jan. 25, 1972

[54] COMPACT, HIGH-POWER, HIGH-EFFICIENCY SILICON AVALANCHE DIODE L-BAND OSCILLATOR

[72] Inventors: Peter Alan Levine, Hightstown; Shing-Gong Liu, Princeton, both of N.J.

[73] Assignee: RCA Corporation

[22] Filed: Nov. 12, 1970

[21] Appl. No.: 89,129

Related U.S. Application Data

[63] Continuation of Ser. No. 796,837, Feb. 5, 1969, abandoned.

[52] U.S. Cl. ........................331/101, 321/69 W, 331/107 R, 333/33, 333/82 B

[51] Int. Cl. ........................................................H03b 7/14

[58] Field of Search ..................331/107 R, 101, 102, 96, 97; 321/69 W; 333/33, 82 B

[56] References Cited

OTHER PUBLICATIONS

Prager et al., " High-power, High-Efficiency Silicon Avalanche Diodes at Ultrahigh Frequencies," Proceedings of the IEEE, April 1967, pp. 586, 587.

*Primary Examiner*—Roy Lake
*Assistant Examiner*—Siegfried H. Grimm
*Attorney*—Edward J. Norton

[57] ABSTRACT

A compact, easily tunable, silicon avalanche diode oscillator for pulsed operation in the L-band which has an efficiency of about 40 percent, equal to that of vacuum tube oscillators operating at these frequencies, is obtained by utilizing a coaxial line composed of three serially connected sections in which the intermediate section has a characteristic impedance significantly larger than either of the other sections. One end of the coaxial line is short circuited; the avalanche diode is coupled to the coaxial line at a point between the short circuit and the beginning of the intermediate section; a variable capacitance is connected across the intermediate section at a given point thereof; and the other end of the coaxial line is connected to the output of the oscillator. The short circuit is made movable with respect to the position of the avalanche diode and the variable capacitance is made adjustable.

9 Claims, 2 Drawing Figures

INVENTORS
Peter A. Levine and
Shing-Gong Liu
BY George J. Seligsohn
ATTORNEY

COMPACT, HIGH-POWER, HIGH-EFFICIENCY SILICON AVALANCHE DIODE L-BAND OSCILLATOR

The present invention is a continuation of application Ser. No. 796,837, filed Feb. 5, 1969, and abandoned contemporaneously with the filing of this application.

The invention herein described was made in the course of or under a contract or subcontract thereunder with the Department of the Air Force.

This invention relates to pulsed high-power avalanche diode oscillators for operation in the L-band and, more particularly, to such oscillators having a size, a simplicity of tuning, and an efficiency of operation significantly higher than that heretofore obtainable.

Since the advent of solid-state diodes and transistors, it has been desirable wherever possible to substitute such solid-state devices for vacuum tubes so as to obtain the inherent advantages of solid-state devices over vacuum tubes, such as small size, ruggedness and long life. However, in order that it be practical to substitute a solid-state device for a vacuum tube in any given application, it is necessary that the solid-state device be capable of performing the same functions as the vacuum tube at an efficiency which is at least comparable to that of the vacuum tube.

An L-band pulsed vacuum tube oscillator producing output power in the order of tens or hundreds of watts can be operated at an overall efficiency in the order of 40 percent or so. A solid-state oscillator operating at this frequency and power range, but having a maximum efficiency of only 25 percent or so, is disclosed in the article "High Power, High Efficiency Silicon Avalanche Diodes at Ultra High Frequencies," by H. J. Prager, K. K. N. Chang and S. Weisbrod, which appears on pages 586 and 587 of the Apr. 1967 issue of Proceedings of the IEEE.

The oscillator disclosed in this article comprises a coaxial structure including a cavity portion in which is situated a silicon avalanche diode. A first sliding short tuner is coupled to one side of the cavity portion and a length of coaxial member couples the other side of the cavity portion to an output adapted to have an external load coupled thereto. In the oscillator disclosed in the article, two spaced sliding short stub tuners are respectively coupled to the coaxial member at separate predetermined positions along the length thereof. The frequency of oscillation, the power output and the efficiency of this oscillator depend upon the tuning of the first tuner and each of the two stub tuners. At best, efficiencies only as high as 25 percent were obtainable from the oscillator disclosed in the aforesaid article. This 25 percent efficiency does not compare favorably with the 40 percent or so overall efficiency of a vacuum tube oscillator operating in this frequency range. Furthermore, the coaxial structure of the oscillator disclosed in this article with its two spaced sliding short stub tuners is quite bulky, since each of the stub tuners along with its tuning rod is nearly a meter long. Even more important is the fact that the tuning of the coaxial structure of the oscillator disclosed in the article is difficult because the tuning of each of the stub tuners and the tuning of the first sliding short stub tuner strongly interacts with each other in controlling the frequency and power of operation of the oscillator.

In accordance with the present invention, it has been found that a compact, easily tunable pulsed L-band avalanche diode oscillator capable of producing high power outputs at high efficiency can be obtained by utilizing a coaxial structure including a first coaxial section having a first characteristic impedance and having one end thereof short circuited, a second coaxial section having a second characteristic impedance and having one end thereof serially connected to the other end of the first coaxial section, a third coaxial section having a third characteristic impedance and having one end thereof serially connected to the other end of the second section with the other end of the third section being connected to the output of the oscillator, the second characteristic impedance being significantly larger than either the first or third characteristic impedance. The coaxial structure further includes a lumped capacitance coupled across the second coaxial section at a first given point intermediate the ends thereof, and an additional section including a cavity portion in which is situated a diode coupled to the first section at a second given point intermediate the ends thereof. The additional section is adapted to be coupled to an energization source for the oscillator. The oscillator then oscillates at a frequency and with a power determined by the value of a first distance which exists between the short-circuited end of the first section and the second given point, the value of the second distance which exists between the second given point and the first given point, and the value of the lumped capacitance. These values may be easily changed to tune the oscillator by making the short circuit movable to adjust the first distance, by utilizing a line stretcher to adjust the second distance, and by making the lumped capacitance variable.

It is therefore an object of the present invention to provide a compact high-power avalanche diode oscillator of improved efficiency which is easily tuned in the L-band.

This and other objects, features and advantages of the present invention will become more apparent from the following detailed description taken together with the accompanying drawing in which.

Figure 1:
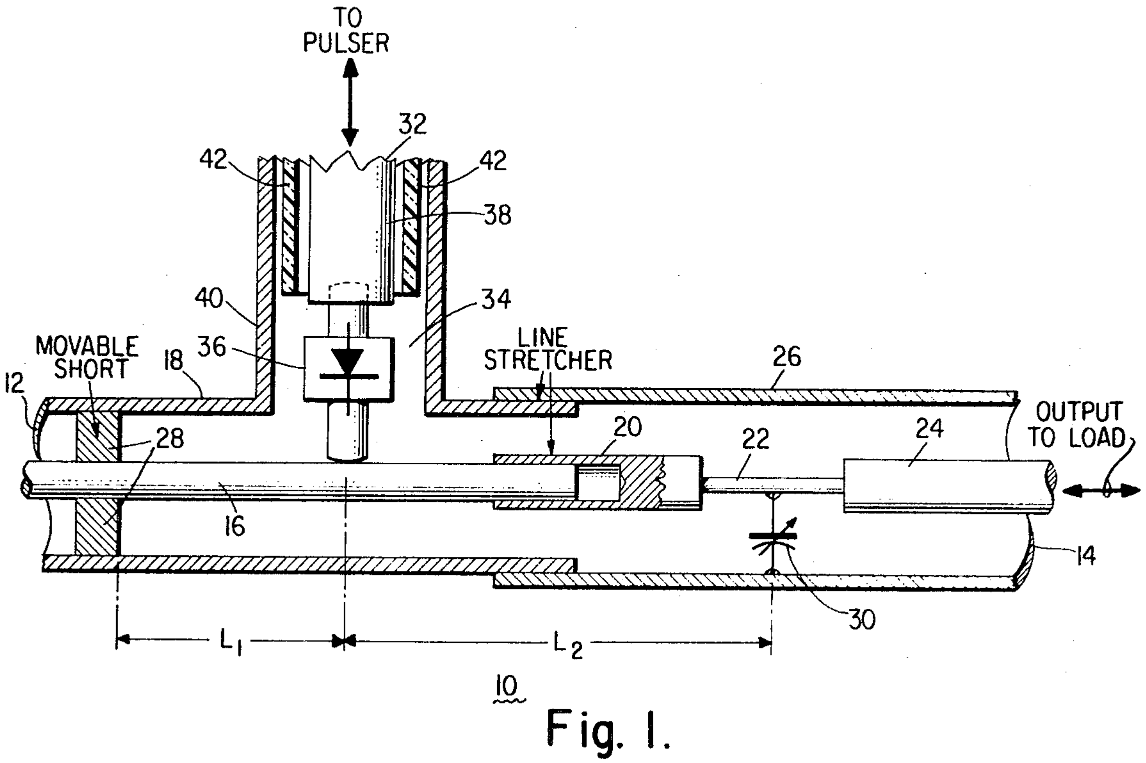
FIG. 1 is a schematic diagram of a preferred embodiment of the invention.

Referring to FIG. 1, avalanche diode oscillator 10 consists of a coaxial structure made up of two telescoping coaxial portions 12 and 14, respectively. Coaxial portion 12 is composed of inner conductor 16 and the portion of outer conductor 18 in cooperative relationship therewith. Coaxial portion 14 includes inner conductor portion 20, inner conductor portion 22, inner conductor portion 24, and the portion of outer conductor 26 in cooperative relationship with these inner conductor portions. Outer conductors 18 and 26 may each have a diameter of about one-half inch, for instance. The inner conductor 16 and inner conductor portions 20 and 24 each have a relatively large diameter, such as one-eighth inch, for instance, while inner conductor portion 22 has relatively a much smaller diameter, such as about one twenty-fourth inch, for instance. The exact values of these conductors are not critical.

Movable short 28 electrically short circuits the point of inner conductor 16 to outer conductor 18 of coaxial portion 12. Coaxial portion 14 contains therewithin a lumped variable capacitance 30, which may be set to have a value between 1 and 10 picofarads, which couples a given point of inner conductor portion 22 to a point of outer conductor 26. The distal end of coaxial portion 14 is coupled to the output of the oscillator.

The only reason for dividing the coaxial structure into two separate telescoping coaxial portions 12 and 14, respectively, is to provide a line-stretching capability to the coaxial structure. Functionally, coaxial portions 12 and 14 together comprise three serially connected coaxial sections. A first of these sections consists of the portion of inner conductor 16 extending to the right of movable short 28 and inner conductor portion 20, and the portion of outer conductors 18 and 26 in cooperative relationship therewith. The second of these sections consists of inner conductor portion 22 and the portion of outer conductor 26 in cooperative relationship therewith. The third of these sections consists of inner conductor portion 24 and the portion of outer conductor 26 in cooperative relationship therewith.

Extending as a T from coaxial portion 12 is an additional coaxial section 32, which includes a cavity portion 34 in which avalanche diode 36 is situated. Additional section 32 includes inner conductor 38 and outer conductor 40. Avalanche diode 36 is connected, as shown, between inner conductor 38 and a given point on inner conductor 16 of the first of the three serially connected coaxial sections. The distance between the position of movable short 28 and the position of the given point at which avalanche diode 36 is connected to inner conductor 16 is designated $L_1$. The distance between the point at which avalanche diode 36 is connected to inner conductor 16 and the given point at which lumped capacitance 30 is connected to inner conductor 22 is designated $L_2$. It will be seen that distance $L_1$ may be adjusted by moving the position of movable short 28 and that the distance $L_2$ may be independently adjusted by moving the relative position of telescoping coaxial portion 14 with respect to that of coaxial portion 12, i.e., making use of the line-stretcher capabilities of the coaxial structure previously described. In addition, the value of variable lumped capacitance 30 may be independently adjusted.

The distal end of additional section 32 is coupled to a pulser, not shown, which acts as an energization source for the oscillator. For example, the pulses provided by the oscillator may have a duration in the order of 1 microsecond and occur at a duty cycle of about 1 percent. Additional section 32 includes therein, situated as shown, a cylinder of dielectric material 42, such as Teflon, which acts as an RF bypass for preventing the oscillations of the oscillator from being fed back to the pulser.

Figure 2:
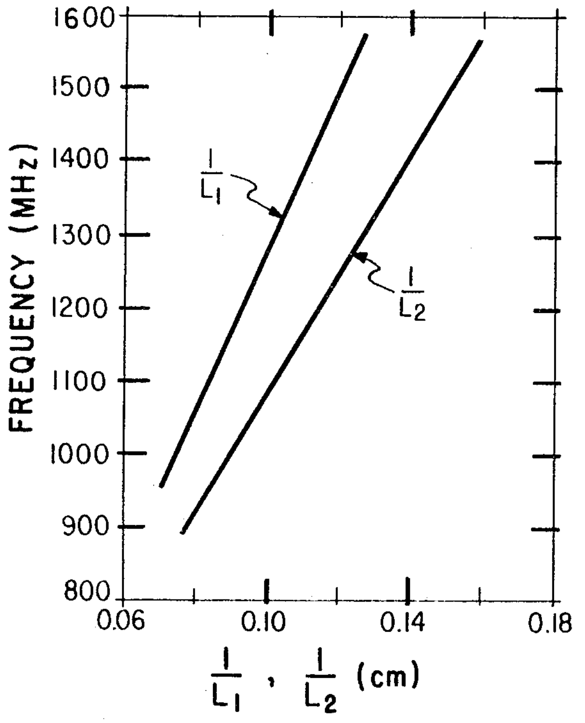
FIG. 2 is a graph showing the frequency of oscillation of the oscillator of FIG. 1 as a function of the reciprocals of two particular distance parameters of the oscillator shown in FIG. 1.

In operation, the oscillator is tuned by properly adjusting the values of the respective distances $L_1$ and $L_2$. FIG. 2 shows the frequency of oscillation of a particular oscillator of the type disclosed herein as a function of the reciprocal of each of the distances $L_1$ and $L_2$ respectively. Variable lumped capacitance 30 is utilized as a trimmer to obtain maximum efficiency of operation.

It will be seen that the characteristic impedance of the second coaxial section, comprising inner conductor portion 22, will be significantly higher than either the characteristic impedance of the first coaxial section, comprising inner conductor 16 and inner conductor portion 20, or the characteristic impedance of the third coaxial section, comprising inner conductor portion 24. Therefore, the second coaxial section together with lumped capacitance 30 acts as a low-pass filter, which enables the circuit to act as an unloaded cavity at harmonic frequencies, including the diode transmit-time frequency. Capacitance 30 also serves to match the diode to the load at the fundamental L-band high-power frequency. Thus, the oscillator will support oscillations at the transit time mode frequency, although this transit time mode frequency is prevented from being applied to the load by the presence of the low-pass filter formed by the relatively high characteristic impedance second coaxial section, comprising inner conductor portion 22, and lumped capacitance 30.

Outputs as high as 180 watts at 40 percent efficiency have been obtained from the disclosed oscillator utilizing avalanche diodes of between 18–23 mils in diameter. These diodes were of silicon mesa structure with junctions formed by boron diffusion into N-on-$N^+$ epitaxial wafers. Breakdown voltages ranged from 120 volts to 150 volts. The frequency of oscillation was tunable over a range of approximately 1.0 GHz. to 1.6 GHz. with less than 1 db. variation in output power. The disclosed oscillator offers the advantage of simple consistent tuning and small size in comparison to oscillators requiring the adjustment of several interacting stubs or slugs.

Although the preferred embodiment comprises a coaxial structure, it should be understood that other types of L-band transmission line, such as microstrip for instance, may be substituted therefor.

What is claimed is:

1. An avalanche diode oscillator comprising an avalanche diode: and a transmission line structure including a first section having a first characteristic impedance and having one end thereof shortcircuited, a second section having a second characteristic impedance and having one end thereof serially connected to the other end of said first section, a third section having a third characteristic impedance and having one end thereof serially connected to the other end of said second section with the other end of said section being connected to the output of said oscillator, said second characteristic impedance being significantly higher than either said first or third characteristic impedance, a lumped capacitance coupled across said second section at a first given point intermediate the ends thereof, and an additional section including a cavity portion in which is situated said diode coupled to said first section at a second given point intermediate the ends thereof, said additional section being adapted to be coupled to an energization source for said oscillator, whereby said oscillator oscillates at a frequency and with a power determined by the value of a first distance which exists between said shortcircuited end of said first section and said second given point, the valve of a second distance which exists between said second given point and said first given point, and the value of said lumped capacitance.

2. The oscillator defined in claim 1, wherein the respective values of said first and second distance are both adjustable and the value of said capacitance is variable.

3. The oscillator defined in claim 1, wherein said additional section is adapted to be coupled to a pulse source.

4. The oscillator defined in claim 1, wherein said cavity portion includes RF bypass means.

5. The oscillator defined in claim 1, wherein said first and third characteristic impedances are substantially equal to each other.

6. The oscillator defined in claim 1, wherein the diameter of outer conductor of all of said three sections are equal and the diameter of inner conductor of said second section is significantly smaller than the diameter of inner conductor of either of said first or third sections.

7. The oscillator defined in claim 6, wherein the diameter of inner conductor of said first and third sections are equal.

8. The oscillator defined in claim 1, wherein all of said sections of said structure are coaxial.

9. The oscillator defined in claim 8, wherein said transmission line structure is an L-band transmission line structure, whereby said oscillator operates in said L-band.

* * * * *

UNITED STATES PATENT OFFICE
CERTIFICATE OF CORRECTION

Patent No. 3,638,141 Dated Jan. 25, 1972

Inventor(s) Peter Alan Levine and Shing-Gong Liu

It is certified that error appears in the above-identified patent and that said Letters Patent are hereby corrected as shown below:

Title page - abstract- line 15, after "the" insert --distance between the avalanche diode and the--

Column 3, line 39 - "transmit" should read --transit--

Column 4, line 18 - after "said" insert --third--

COlumn 4, line 29 - "valve" should read --value--

Signed and sealed this 22nd day of August 1972.

(SEAL)
Attest:

EDWARD M.FLETCHER,JR.
Attesting Officer

ROBERT GOTTSCHALK
Commissioner of Patents